(12) United States Patent
Senda et al.

(10) Patent No.: US 6,924,515 B2
(45) Date of Patent: Aug. 2, 2005

(54) SEMICONDUCTOR LIGHT-EMITTING ELEMENT

(75) Inventors: Masanobu Senda, Aichi (JP); Jun Ito, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/454,581

(22) Filed: Jun. 5, 2003

(65) Prior Publication Data

US 2003/0227065 A1 Dec. 11, 2003

(30) Foreign Application Priority Data

Jun. 6, 2002 (JP) .................................. P2002-165074

(51) Int. Cl.$^7$ ................. H01L 31/0328; H01L 31/0336; H01L 31/072; H01L 31/184
(52) U.S. Cl. ..................... 257/189; 257/431; 257/432
(58) Field of Search .................. 257/94–98, 189, 257/431, 432; 438/22, 25–29, 48

(56) References Cited

U.S. PATENT DOCUMENTS

| | | | | |
|---|---|---|---|---|
| 5,981,977 | A | * 11/1999 | Furukawa et al. | 257/94 |
| 6,153,894 | A | * 11/2000 | Udagawa | 257/96 |
| 6,724,013 | B2 | * 4/2004 | Kneissl et al. | 257/79 |
| 6,727,518 | B2 | * 4/2004 | Uemura et al. | 257/79 |
| 2002/0030201 | A1 | * 3/2002 | Uemura | 257/189 |
| 2002/0145148 | A1 | * 10/2002 | Okuyama et al. | 257/88 |

FOREIGN PATENT DOCUMENTS

| | | |
|---|---|---|
| JP | 10-32189 | 2/1998 |
| JP | 11-251633 | 9/1999 |
| JP | 11-266058 | 9/1999 |
| JP | 2000-036619 | 2/2000 |
| JP | 2001-102673 | 4/2001 |
| JP | 2001-160657 | 6/2001 |
| JP | 2001-251018 | 9/2001 |
| JP | 2001-332762 | 11/2001 |

OTHER PUBLICATIONS

Gen–ichi Hatakoshi, *Operation Mechanism of light–emitting diodes*, "Applied Physics", Oyo Buturi, vol. 68, No. 2, pp. 133–138, 1999.

(Continued)

*Primary Examiner*—Tom Thomas
*Assistant Examiner*—Edgardo Ortiz
(74) *Attorney, Agent, or Firm*—McGinn & Gibb, PLLC (57) ABSTRACT

The invention is to realize such a semiconductor light-emitting element which is higher in external quantum efficiency than an existing LED, and lower in production cost than an existing semiconductor laser. The light transmission insulating film is formed on a continuously incline face comprising the semiconductor layers having an opening angle etched in right angled V. The V shape incline is formed by a known technique, and both left and right inclined faces have the angle of 45°. Depending on the length of δ or the position of the light reflecting portion, probability that the light in duration of resonance is reflected may be made optimum or preferable. According to this structure, it is no longer necessary to carry out processing treatments of high degree, high precision, or high cost such as, e.g., multi-layered film coating in a resonance direction, and it is possible to structure the semiconductor light-emitting element having a resonating mechanism as a resonator though not forming end faces of high cost.

20 Claims, 5 Drawing Sheets

OTHER PUBLICATIONS

Norihide Yamada, *Primary technologies for hight–efficiency visible LEDs.* "Applied Physics", Oyo Buturi, vol. 68, No. 2, pp. 139–145, 1999.

Shuji Nakamura, *Development of violet InGaN–based later diodes*, "Applied Physics", Oyo Butari, vol. 68, No. 7, pp. 793–796, 1999.

Akito Kuramata, et al., *Continuous–wave operation InGaN laser diodes on SiC substrates*, "Applied Physics", Oyo Buturi, vol. 68, No. 7, pp. 797–800, 1999.

Masao Ikeda, et al. Raised–pressure MOVPE and AlGaInN laser diodes, "Applied Physics", vol. 68, No. 7, pp. 801–804, 1999.

"Handbook of Materials for Advanced Devices", (edited by Incorporated Denshi Joho Tsushin Associates), 5th Edition, Chapter 1, pp. 488–511, 1993.

* cited by examiner

SEMICONDUCTOR LIGHT-EMITTING ELEMENT

The present application is based on Japanese Patent Application No. 2002-165074, which is incorporated herein by reference.

BACKGROUND OF THE INVENTION

1. Field of the Invention

The present invention relates to a semiconductor light-emitting element formed by laminating a plurality of Group III nitride compound semiconductors. The semiconductor light-emitting element according to the invention can be expected for industrial utility values as a new light-emitting device substituting for existing luminous light sources, for example, fluorescent lamps.

2. Description of the Related Art

As the semiconductor light-emitting element formed by laminating the plurality of Group III nitride compound semiconductors, there are widely known those described in, for example, "Applied Physics (OYO BUTURI) vol. 68, No. 2, pp. 133 to 145 (1999)" (called as 'Literature 1' hereafter), or "Applied Physics (OYO BUTURI) vol. 68, No. 7, pp. 793 to 804 (1999)" (called as 'Literature 2' hereafter), otherwise "Handbook of Materials for Advanced Devices (edited by Incorporated Denshi Joho Tsushin Associates) 5th Edition, Chapter 1, pp. 488 to 511 (1993)" (called as 'Literature 3' hereafter).

A conventional semiconductor laser has a structure which takes out outside of a device one part of a light resonating from a reflecting face of high reflectance. Accordingly, in the conventional semiconductor laser, the light reflectance must be heightened in the reflecting faces at both ends in the resonance direction of a resonator for structuring a laser of good efficiency. That is, since the resonator of the conventional light-emitting element (a semiconductor laser) emits one part of the light in duration of resonance as it is in the resonance direction of the light, an end face of at least one end in the resonance direction of the resonator must be formed with a structure having high reflectance and light transmittance of less loss.

Therefore, for producing the semiconductor laser, the art in the above has to form the reflecting face of the high reflectance, so that high production costs cannot but be taken for treating the reflecting face such as preparing multi-layer coats.

Further, in the conventional semiconductor laser, a radiation structure or setting-up steps are inevitably complicated, largely causing these circumstances to heighten production costs.

On the other hand, in an existing LED, as described in, for example, the above Literature 1, it is difficult to get a high external quantum efficiency. According to now generally known technical criteria, it is said that the external quantum efficiency is limited to be around 20 to 30% as seen from the above Literatures.

SUMMARY OF THE INVENTION

The invention has been accomplished for settling the above mentioned problems, and it is an object of the invention to realize such a semiconductor light-emitting element which is higher in the external quantum efficiency than the existing LED, and cheaper in the production cost than the existing semiconductor laser.

For settling the above mentioned problems, the following instruments are useful.

That is, a first instrument of the invention is that the semiconductor light-emitting element formed by laminating a plurality of Group III nitride compound semiconductors, is provided with a light reflecting portion in an interior of a light-emitting layer for reflecting a light in another direction such as a face direction, said light resonating in a horizontal direction within the light-emitting layer.

The "face direction" is meant by a direction almost vertical (normal direction) with respect to the plan shape of the light-emitting layer.

In other words, the light reflecting portion reflects light resonating in a horizontal direction within the light-emitting layer in a direction which at least includes a direction substantially vertical with respect to a plan shape of the light-emitting layer and is different from the horizontal direction.

According to the above mentioned structure, an output light emitting direction may not be the light resonating direction. Therefore, it is not always necessary to carry out a processing treatment, high precision or high cost such as the multi-layered coating, and although not forming the end faces of high cost, it is possible to structure the semiconductor light-emitting element having a resonance mechanism as a resonator. In the structure, for the end faces at both ends of the resonators or physical characteristics in the light reflecting portions, light transmittance is not necessary to be taken into consideration, but only high reflectance is demanded. Therefore, these reflecting portions can be easily structured by using, for example, insulating reflection members, metal layers, and the reflecting portions is easily (at low cost) given reflectance higher than the conventional one.

The light output from the light-emitting element of the invention is not limited to the light reflected by the light reflecting portions after resonance. That is, the light output from the light-emitting element includes lights under the same conditions as LED of the face emission.

Owing to these workings, according to the light-emitting element of the invention, it is possible to realize such semiconductor light-emitting element of the external quantum efficiency higher than the existing LED and lower in the production cost than the existing semiconductor laser.

By the way, as methods of forming (the reflecting faces of) the above mentioned light reflecting portions, various kinds of etching treatment such as ion beam etching are useful. Further, generally and widely known methods of providing appropriate inclined angles to these reflecting faces are set forth in Unexamined Japanese Patent Publication No. Hei-10-032189, "Dry etching method and element of Group III nitride semiconductor", or in Unexamined Japanese Patent Publication No. 0.2001-160657, "Method for manufacturing a Group III nitride compound semiconductor laser".

A second instrument of the invention is, in the above first instrument, that a length of the light reflecting portion in the resonance direction is determined to be shorter than a wavelength of the light within at least a single light-emitting layer of at least a single well layer.

It is sufficient that the light reflecting portion is formed in dot and studded within the light-emitting layer, otherwise the light reflecting portion is continuously formed in slit almost in parallel with the end faces. For example, in the latter case, in at least the resonance direction within the single light-emitting layer or the well layer, if setting the length of the light reflecting portion to be shorter than the wavelength of the emitted (reflected) light, the light in duration of resonance is probably reflected and emitted via the light reflecting portion.

That is, with: this structure, while a resonance mode is being established between both end faces, the resonance light can be probably oscillated.

A third instrument is, in the first or second instrument, that the light extracting face is provided at a face different from a face having metallic electrodes.

That is, this is such a system that the light-emitting element of the invention is formed to be flip-chip type for extracting the light from the side of the crystal growth substrate.

According to the above structure, as easily supposed from the Literature 1, since the light extracting face is secured to the most, it is possible to efficiently take out the light under the same conditions as LED of the face emission, so that the external quantum efficiency may be made large. This system displays a big effect when using the light transmitting substrate as sapphire.

A fourth instrument is, in any one of the first to third instruments, that the light-emitting layer has the well layer of at least one layer, and the well layer is formed of Group III nitride compound semiconductor having a composition of $Al_xGa_yIn_{(1-x-y)}N(0\leq x<1, 0\leq y<1, 0<x+y<1)$ and containing no additives or optional additives. As the above mentioned additives, Group III elements as boron (B) or Group V elements as phosphorus (P) may be added.

With these structures, a high internal quantum efficiency may be obtained similarly to the well known Group III nitride compound semiconductor light-emitting element.

A fifth instrument is, in any one of the first to fifth instruments, that at least one part of the light reflecting face of the light reflecting portion is formed with a metal.

For example, with such a structure, it is possible to form the reflecting face. (the light reflecting portion) having comparatively high reflectance, so that it is easy or possible to produce the semiconductor light-emitting element of the high external quantum efficiency.

A sixth instrument is, in the fifth instrument, that the metal of forming the at least one part of the light reflecting faces has the same composition as that of a metal of forming an at least any one of electrodes.

It is thereby possible to unify a process of forming the light reflecting face of the light reflecting portion and a process of forming the at least any one part of electrodes into one process. Therefore, such an effect can be obtained which curtails the number of processes of evaporating the metal used to the electrodes or reflecting faces.

A seventh instrument is, in any one of the first to sixth instruments, that at least one part of the light reflecting face is made have an inclined angle of around 45° with respect to said resonance direction.

It is thereby possible to emit the light resonating within the resonator (light-emitting layer) straightly in the face direction, so that the light collides against other parts as side walls to suppress probability of the light reflecting or dispersing in unexpected directions, and to enable to effectively obtain the high external quantum efficiency.

Methods of forming the inclined part (light reflecting face) with desired angles are useful in the method set forth in, for example, Unexamined Japanese Patent Publication No. 2001-160657, "Method for manufacturing a Group III nitride compound semiconductor laser".

Further, an eighth instrument is, in any one of the first to seventh instruments, that one part of the light reflecting face is made have an inclined angle of around 90° with respect to said resonance direction.

With this structure, one part of the light injecting into the light reflecting face of the light reflecting portion can be again returned to a resonance mode, whereby it is possible to reduce the probability that the light of the resonance mode is reflected (emitted) in the face direction.

At the same time, in this part, since the inclined angle of the light reflecting portion is right angled, the length in the resonance direction of the light reflecting portion can be shortened.

A ninth instrument is, in any one of the first to the eighth instrument, that a reflecting film is formed on a side wall of the light-emitting layer positioning at a terminal end in the resonance direction.

As to embodiments of forming the reflecting film, at least two are considered as follows.

That is, a tenth instrument is, in the ninth instrument, that the reflecting film is composed of an opaque insulating film. For forming the film on the side wall of the light-emitting layer, the film to be formed is generally demanded to have insularity, but according to the tenth instrument, the ninth instrument can be provided with once forming process.

An eleventh instrument is, in the ninth instrument, that the reflecting film is made of a structure of two layers of a light transmission insulating film and the metal layer. Depending on this structure, the insularity and the high reflectance may be compatible.

A twelfth instrument is, in the eleventh instrument, that the above metal layer has substantially the same composition as that of a metal forming at least any one of the electrodes.

Methods or embodiments of forming the two layered reflecting film on the side wall of the light-emitting layer are generally widely known in the technique set forth in Unexamined Japanese Patent Publication No. Hei-11-251633, "Gallium nitride compound semiconductor element".

Also in case of using the light transmittance insulating film, if a second metal layer of the two-layered reflecting film is formed at the same time as other metal layers such as electrode, this easily contributes to curtailment of the processes.

A thirteenth instrument of the invention is, in the first to twelfth instruments, that a slit having substantially the same size and shape in plan as those of the light reflecting portion in the vicinity of the light extracting face at an upper part of the light reflecting portion.

This structure will be specifically exemplified in a later mentioned explanation of a second embodiment. Depending on this instrument, the light emitted from the well layer may be limited almost to an only coherent light reflected on the light reflecting face of the light reflecting portion.

Accordingly, this instrument is useful to easily producing the semiconductor laser laser.

A fourteenth instrument is, in the thirteenth instrument, that the slit is provided by forming a metallic film over the light extracting face of a crystal growth substrate.

By this instrument, a light cutting-off portion (the part of the metallic layer) forming the slit is reduced in size, whereby the semiconductor laser having the above slit may be made minimum size. Thus, the instrument is useful to production of cheap and miniaturized semiconductor laser.

A fifteenth instrument of the invention is that a semiconductor light-emitting element set forth in any of the above instruments are produced by arranging a plurality of the above mentioned light-emitting elements of semiconductor on one sheet of the crystal growth substrate, whereby the semiconductor set forth in any of the above mentioned light-emitting elements of are integrated.

By this integration, it is easy or possible to miniaturize or cost down the semiconductor light-emitting element of comparatively large output. This light-emitting element is also useful to not only illumination but communications or information process as, for example, the under mentioned two instruments.

A sixteenth instrument of the invention is, in the communication apparatus, provided with the semiconductor light-emitting element set forth in the fifteenth instrument formed by integrating the fourteenth instrument.

A seventeenth instrument of the invention is, in the communication apparatus, provided with the semiconductor light-emitting element set forth in the fifteenth instrument formed by integrating the fourteenth instrument.

In the communication apparatus provided with the semiconductor light-emitting element set forth in the fifteenth instrument formed by integrating the fourteenth instrument, the fine face luminous lasers of a flip-chip type may be arranged in plan, so that such semiconductor light-emitting elements are also useful to applications of parallel data transmissions or light information process.

The respective semiconductor layers forming the above mentioned semiconductor light-emitting elements may be formed with Group III nitride compound semiconductor comprising binary, ternary or quaternary semiconductors shown with at least $Al_xGa_yIn_{(1-x-y)}N(0 \leq x<1, 0 \leq y<1, 0<x+y<1)$. Part of Group III elements maybe substituted with boron (B) or thallium (Tl), and part of nitrogen (N) may be replaced with phosphorus (P), arsenic (As), antimony (Sb) or bismuth (Bi).

When using these semiconductors to form an n-type layer of Group III nitride compound semiconductor, Si, Ge, Se, or C may be added as n-type impurities, and Zn, Mg, Be, Ca, Sr, or Ba may be added as p-type impurities.

As substrates for causing these semiconductors to crystal-grow, available are sapphire, spinel, Si, SiC, ZnO, MgO, or mono-crystals of Group III nitride compounds.

As methods for causing these semiconductors to crystal-grow, useful are molecular beam epitaxy method (MBE), metal organic chemical vapor deposition method (MOCVD), halide vapor phase growth method (HDVP), or liquid phase growth method.

For heightening the reflecting efficiency of the light as reflection metal film of forming the insulating film on the side wall of the resonator, or a material of positive electrode, available are Al, In, Cu, Ag, Pt, Ir, Pd, Rh, W, Mo, Ti, or Ni, otherwise alloys containing more than one kind thereof.

By means of the instruments of the invention, the above mentioned problems can be solved effectively or rationally.

DETAILED DESCRIPTION OF THE PREFERRED EMBODIMENTS

In the following description, the invention will be explained on the basis of specific embodiments, provided that the invention is not limited to the under mentioned embodiments.

[First Embodiment]

Figure 1:
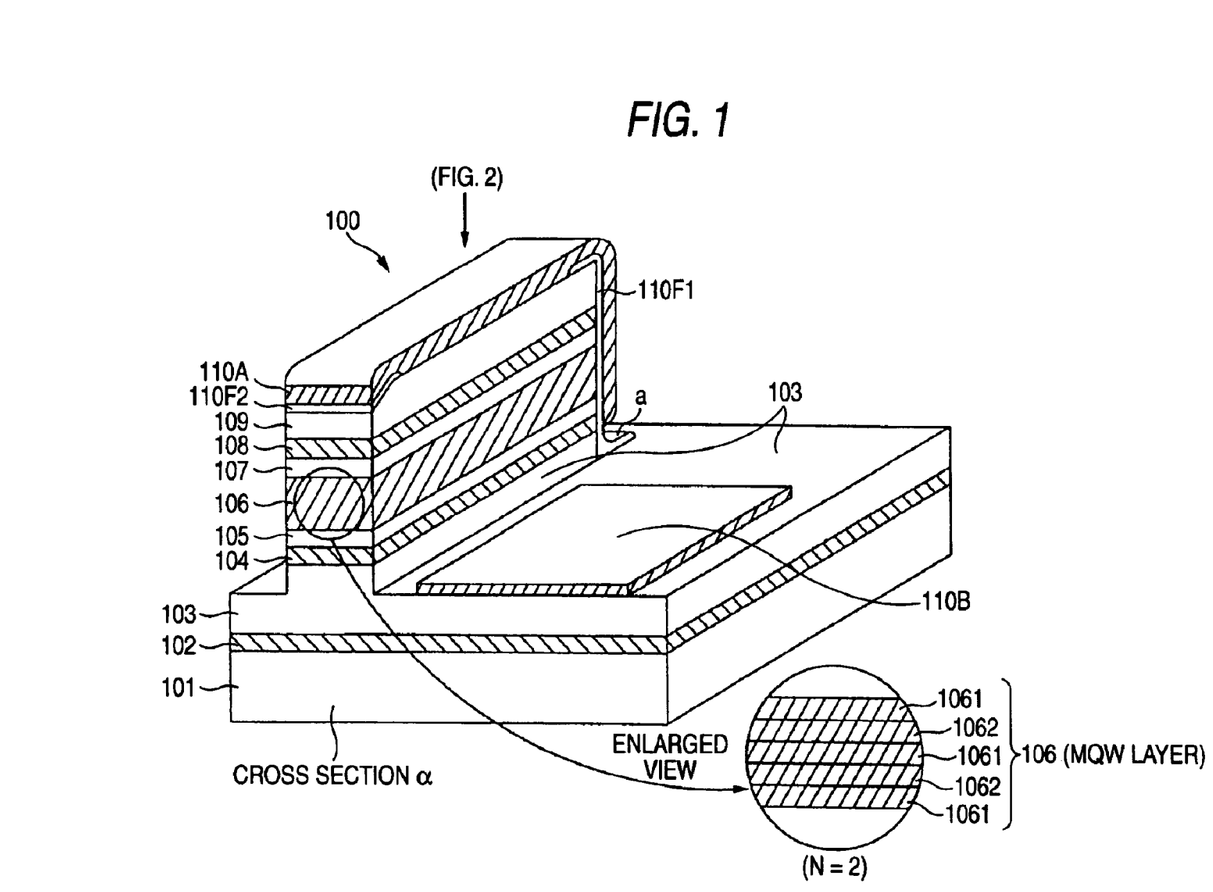
FIG. 1 shows a perspective view of the cross section a of the light-emitting element 100 of semiconductor according to the first embodiment of the invention.

FIG. 1 is a perspective view of the cross section a of the semiconductor light-emitting element 100 according to the first embodiment of the invention.

On a sapphire substrate 101, a buffer layer 102 of about 200 Å thickness containing aluminum nitride (AlN) is mounted, and a layer 103 is thereon formed which contains GaN of silicon (Si) dope, has about 4.0 $\mu$m thickness, and high carrier concentration $n^+$.

On the layer 103 of high carrier concentration $n^+$, an n-type layer 104 is laminated which contains $Al_{0.10}Ga_{0.90}N$ of a silicon (Si) dope and has about 1 $\mu$m thickness, and the n-type layer 105 of about 100 nm thickness is thereon formed. The n-type layer 105 is $Al_{0.01}Ga_{0.99}N$ of the silicon (Si) dope of electron concentration ($2\times10^{18}/cm^3$) being laminated about 100 nm.

Further thereon, an MQW layer 106 of a multi-quantum well-type structure is formed which is laminated alternately with the well layer of $Ga_{0.8}In_{0.2}N$ of about 30 Å thickness and a barrier layer 1062 containing GaN of about 70 Å thickness, and the laminating number N of the barrier layer is 2. That is, the three well layers 1061 and the two barrier layers 1062 are alternately laminated, so that the MQW structure of five layers in total of about 230 Å thickness is composed.

On the MQW layer 106, a p-type layer 107 of about 100 nm thickness is formed. The p-type layer 107 is $Al_{0.01}Ga_{0.99}N$ of the magnesium (Mg) dope of hole concentration ($5\times10^{17}/cm^3$) being laminated about 100 nm.

Further, on the p-type layer 107, the p-type layer 108 is laminated which contains $Al_{0.01}Ga_{0.99}N$ of a magnesium (Mg) dope and has about 1 $\mu$m thickness.

On the p-type layer 108, a p-type contact layer 109 of about 600 Å thickness comprising GaN of the magnesium (Mg) dope is formed.

On the p-type contact layer 109, a positive electrode 110A is formed via a metallization, and on an $n^+$ layer 103, a negative electrode 110B is formed.

Figure 2:
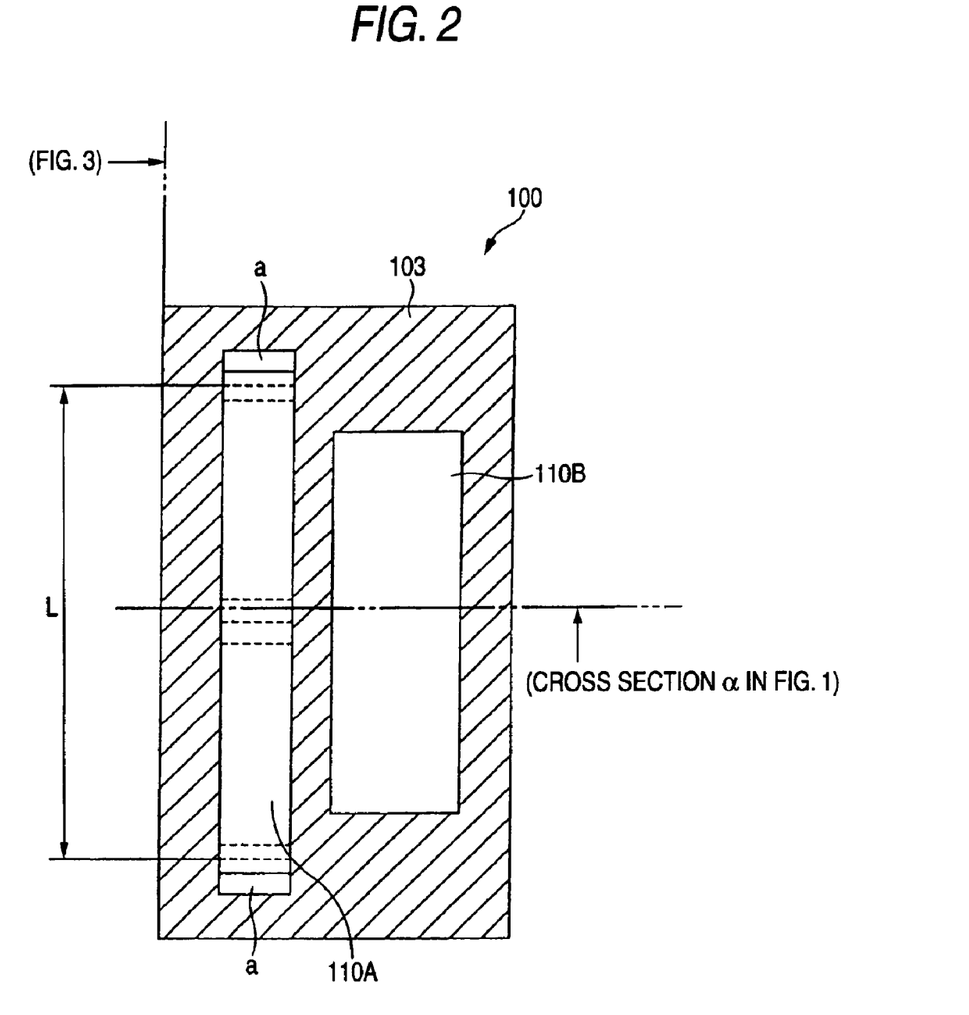
FIG. 2 shows a plan view of the light-emitting element 100 of semiconductor seen from the upper side (electrode side)

FIG. 2 shows a plan view of the semiconductor light-emitting element 100 seen from the upper side (the electrode side).

A length L (the distance between both end faces) of: the resonator is enough with, for example, about 50 to 100 $\mu$m. The length L of the resonator is determined in accordance with a known setting criterion on the basis of a desired wavelength concerned with reflective index of the semiconductor or the output light. Such a setting criterion is set forth in detail in the Literature 3.

Reference mark "a" designates the hem of the light transmission insulating film 110F1 of FIG. 1.

Figure 3:
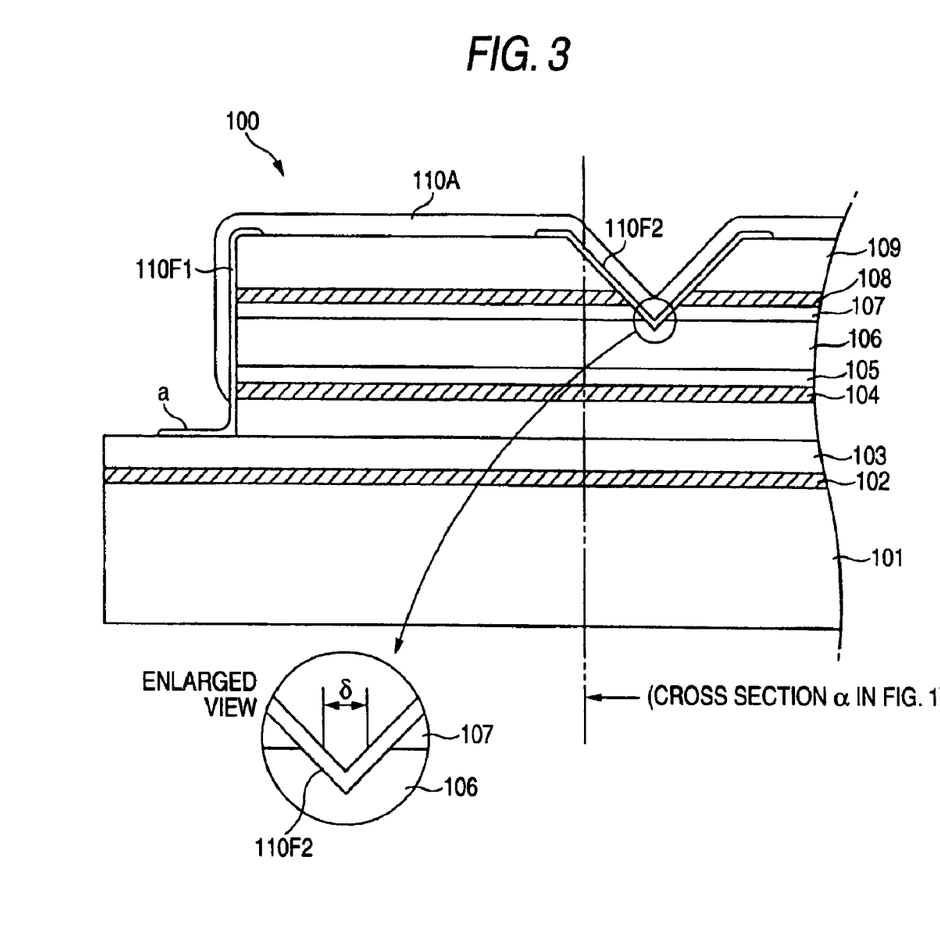
FIG. 3 shows a side view of the light-emitting element 100 of semiconductor.

FIG. 3 is a side view of the semiconductor light-emitting element 100. The light transmission insulating film 110F2 is formed on a continuously inclined face comprising the semiconductor layers 106 to 109 having an opening angle etched in right angled V. The V shape inclined is formed by an etching technique set forth in Unexamined Japanese Patent Publication No. 2001-160657, "Method for manufacturing a Group III nitride compound semiconductor laser", and both left and right inclined faces have the angle of 45°.

A length δ in the resonance direction of the light reflecting portion within the light-emitting layer is determined to be less than 400 nm, for example, if the above mentioned semiconductor light-emitting element 100 is blue, and in this case, more desirably 1 to several tens nm. Depending on the length of δ or the position of the light reflecting portion, probability that the light in duration of resonance is reflected may be made optimum or preferable.

The respective electrodes are formed with film via evaporation. The positive electrode 110A comprises a three-layered structure of a first metal layer composed of rhodium (Rh) or platinum (Pt) of about 0.3 $\mu$m thickness contacting the P-type contact layer 109, a second metal layer composed of titanium (Ti) of about 30 Å thickness formed on the first metal layer, and a third metal layer composed of gold (Au) of about 1.2 $\mu$m thickness formed on the third metal layer.

With the above mentioned structure, it is possible to easily and exactly secure the reflectance at end faces of the resonator formed with the two-layered structure composed of the metal layer made of an elongated part of the positive electrode 110A and the light transmission insulating film 110F1, and the light resonating between both end faces is probably reflected at the light reflecting face of the light reflecting portion, and emitted (induction-emitted) in the face direction (side of the substrate 101).

Further, there is also a light which is naturally emitted in accordance with the luminous mechanism of LED. The naturally emitted light includes a light which is directly emitted toward the side of the light extracting face (the side of the substrate 101) and a light which is once reflected by the positive electrode 110A and then is emitted toward the side of the light extracting face (side of the substrate 101).

With such structures, the light-emitting element of comparatively high external quantum efficiency can be produced at comparatively low cost.

By the way, it is also sufficient that the opening angle in V is 45°, while the only inclined angle in the inclined face of one side of the light reflecting portion is 90°. In this case, since the reflecting light in the reflecting face of the 90° inclined angle is again returned to an injected path, the reflected light can be again returned to the resonance mode by effecting an optimum adjustment to the position of the light reflecting portion.

Following this structure, it is possible to halve the length of the above δ, and limit a direction to which the emitted light comes to only one side for the light to inject into the inclined face of the 45° incline angle, so that the probability of the induced emission can be reduced until about ¼ of the above first embodiment.

The semiconductor layers 105, 107 (both of the p-type/the n-type) are not necessarily provided, respectively. In case desirably the wavelength or the phase of the emitted light are comparatively uniform, it is desirable to provide the semiconductor layers 105, 107 as, for example, the first embodiment, but in case of demanding to strongly lead the characteristic of LED, the semiconductor layers 105, 107 are not required. By omitting the semiconductor layers 105, 107, it is possible to strongly lead the characteristic of LED that incoherent light is much emitted.

Further, in such a case, it is sufficient to provide the only semiconductor positioning at a side remote from the light extracting face. In addition, the semiconductor layers 105, 107 may have respectively separate two layered structure.

The widths of the respective semiconductor layers which are horizontal (that is, parallel with the crystal growth face of the crystal growth substrate) and vertical with respect to the resonance direction, are not always relatively narrow as seen in FIG. 1. For strongly leading the characteristics of LED, these widths may be secured to be comparatively wide. The widths of the respective semiconductor layers which are vertical with respect to the resonance direction, are able to be enlarged until equivalent level to the conventional LED. Also by determining the width, it is possible to strongly lead the characteristic of LED as that incoherent light is much emitted.

[Second Embodiment]

Figure 4:
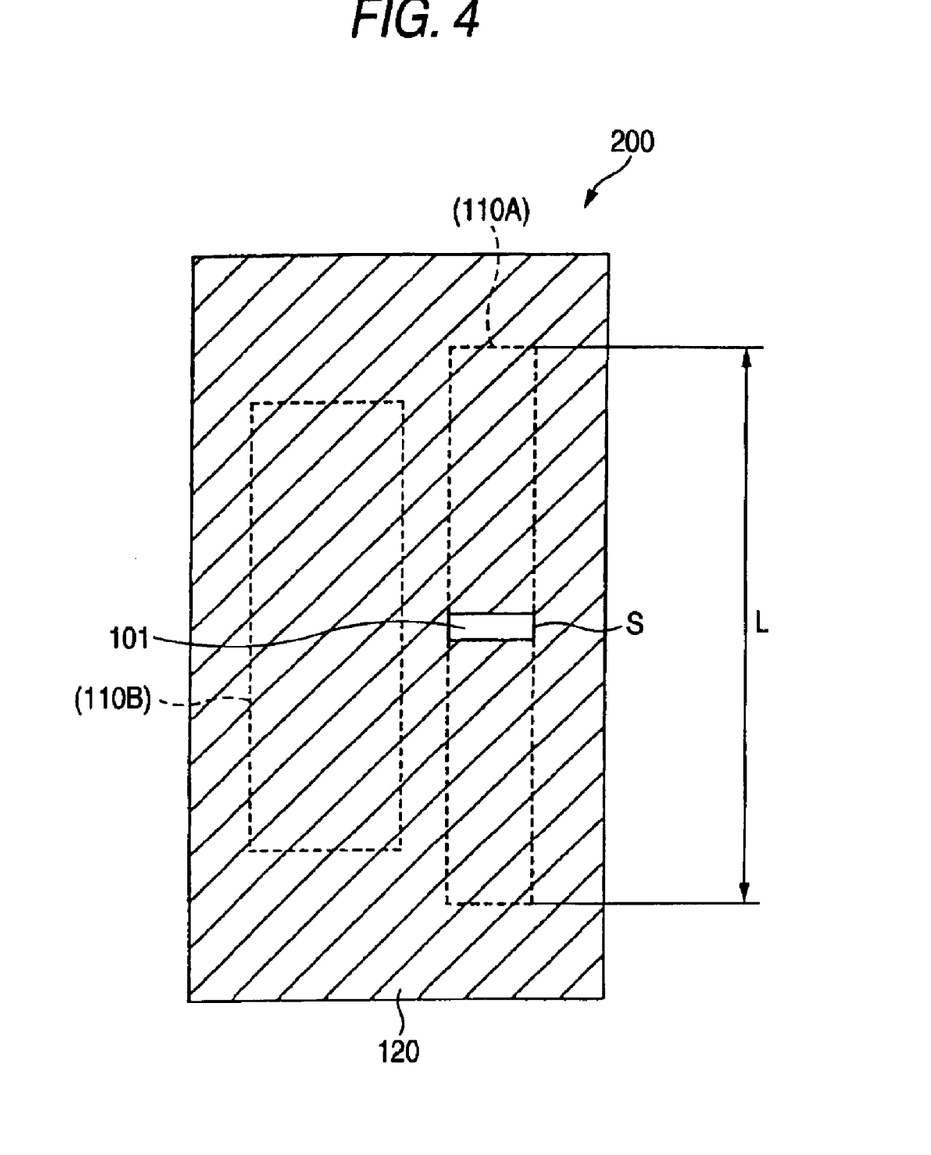
FIG. 4 shows a plan view of the rear side (light extracting face) of the light-emitting element 200 of semiconductor according to the second embodiment of the invention.

FIG. 4 is a plan view of the rear side (light extracting face) of the light-emitting element 200 of semiconductor according to the second embodiment of the invention. This light-emitting element 200 of semiconductor is made by further evaporating a metal layer 120 to the light extracting face (an exposed face of the substrate 101) of the light-emitting element 100 of semiconductor of the first embodiment. In this light-emitting element 200 of semiconductor, all the light extracting face of the exposed substrate 101 excepting the part of the slit S are covered with the metal layer 120.

For example, according to this structure, the light emitted from the semiconductor light-emitting element can be limited to the only coherent light reflected on the light reflecting face of the light reflecting portion in duration of resonance. Besides, with the structure, a light cutting-off portion (the part of the metal layer) formed with the slit can be made compact, so that the semiconductor laser having the slit can be reduced to the minimum size.

[Third Embodiment]

Figure 5:
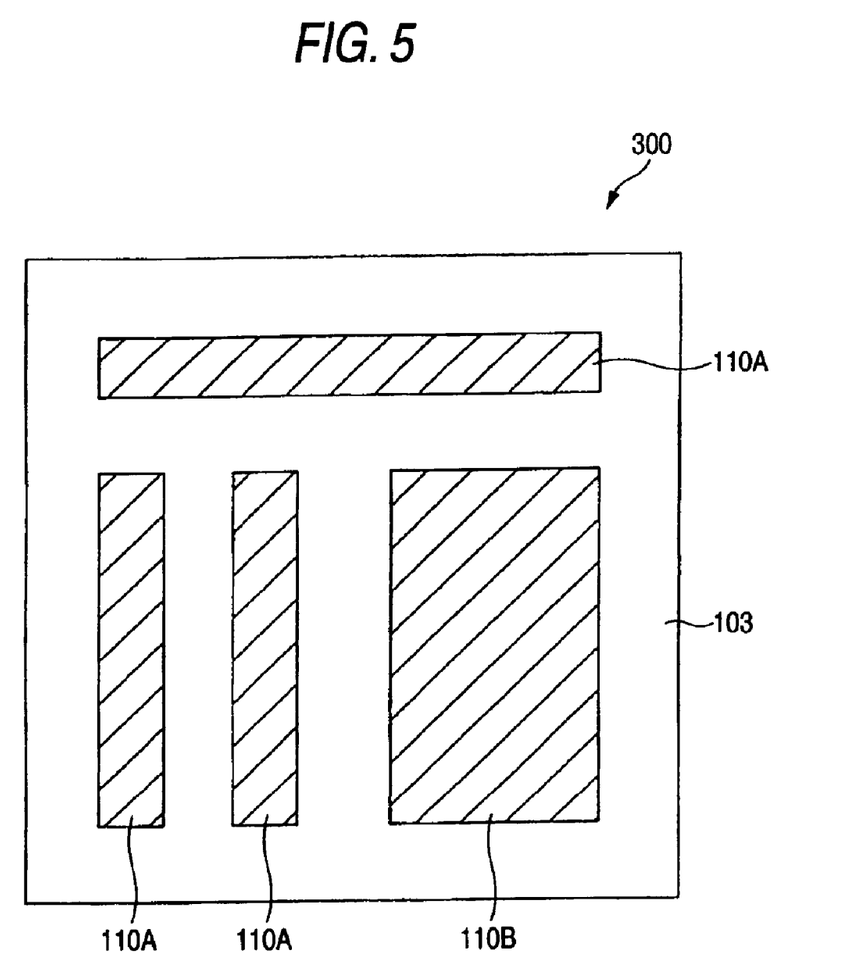
FIG. 5 shows a plan view of the light-emitting element 300 of semiconductor seen from the upper side (electrode side) according to the third embodiment of the invention.

FIG. 5 is a plan view of the light-emitting element 300 of semiconductor seen from the upper side (electrode side) according to the third embodiment of the invention. Under the positive electrodes 110A, though not showing, there are respectively disposed the equivalent resonators to those of the light-emitting element 200 of semiconductor.

For example, according to the instruments of the invention, the semiconductor laser can be comparatively easily structured, and accordingly the integration thereof is easy.

By integrating the semiconductor light-emitting element, the fine face luminous lasers of a flip-chip type may be arranged in plan, so that such semiconductor light-emitting elements are also useful to applications of parallel data transmissions or light information process.

[Other Modifications]

The semiconductor light-emitting element of the invention can be structured by optionally combining, for example, the following known techniques (1) to (3). Also using these applied techniques, workings and effects of these known techniques can be obtained without spoiling the workings and effects based on the invention.

(1) Dissolution of Difference in Level

When producing the flip-chip type light-emitting element, for example, the positive electrode and the negative electrode are different in height as seen in the above examples, and when setting them up, this difference sometimes brings about a problem to securing precision in the light outputting direction. In such occasions, useful are the structures of the elements described in Unexamined Japanese Patent Publication No. Hei-11-266058, Gallium nitride compound semiconductor laser diode, otherwise Unexamined Japanese Patent Publication No. 2001-102673, "Group III nitride compound semiconductor laser diode".

(2) Arrangements of Electrodes

There are some known applied techniques of mainly arranging the electrodes for favorably securing the external quantum efficiency of the light-emitting element, productivity thereof, or heat radiation of the same. For making these various conditions desirable or optimum, for example, useful are the structures of the elements described in Unexamined Japanese Patent Publication No. 2001-102673, "Group III nitride compound semiconductor laser diode", otherwise Unexamined Japanese Patent Publication No. 2001-251018, "Group III nitride compound semiconductor laser".

Metals ready for highly securing the adhesion with the Group III nitride compound semiconductor or reflectance include Rh, Pt, Ru, Ag, Pd, Al, Ni, or Co. As a method of forming the metal layers using them or the electrodes, known are the structures of the elements described in Unexamined Japanese Patent Publication No. 2000-036619, "Group III nitride compound semiconductor light-emitting device".

(3) Forming Films of Metal Layers

As the film forming embodiments of the metal layer 120 for forming the slit S of the second embodiment, useful are the structures of the elements described in Unexamined Japanese Patent Publication No. 2001-102673, "Group III nitride compound semiconductor laser diode", otherwise the structures of the elements and the methods thereof described in Unexamined Japanese Patent Publication No. 2001-332762, "Group III nitride compound semiconductor light-emitting element and manufacturing method thereof".

For example, in case of using the film forming embodiment of the former, it is possible to render this metal layer to be the electrode (the negative electrode). In this case, the substrate 101 or the buffer layer 102 are necessarily rendered to be conductive, but depending on this structure, the negative electrode to be provided on the plan of FIG. 5 is unnecessary, so that the resonators can be more efficiently arranged on the plan of FIG. 5.

This invention is not limited to the aforementioned description of the mode for carrying out the invention and the embodiments thereof at all, and includes various modifications that can be conceived by those skilled in the art without departing from the scope of claim for a patent.

What is claimed is:

1. A semiconductor light-emitting element comprising:
   a plurality of laminated Group III nitride compound semiconductors; and
   a light reflecting portion formed in an interior of a light-emitting layer, said light reflecting portion reflecting a light which resonates in a horizontal direction and within the light-emitting layer in a direction which at least includes a direction substantially vertical with respect to a plan shape of the light-emitting layer and is different from the horizontal direction.

2. A semiconductor light-emitting element according to claim 1, wherein a length of the light reflecting portion in a resonance direction is shorter than a wavelength of said light within at least one of a single light-emitting layer and a single well layer.

3. A semiconductor light-emitting element according to claim 1, wherein a light extracting face is provided at a face different from a face including a metallic electrode.

4. A semiconductor light-emitting element according to claim 1, wherein the light-emitting layer includes at least one well layer, and the well layer comprises a Group III nitride compound semiconductor including a composition of $Al_xGa_yIn_{(1-x-y)}N(0 \leq x < 1, 0 \leq y < 1, 0 < x+y < 1)$ and containing no additives or optional additives.

5. A semiconductor light-emitting element according to claim 1, wherein at least one part of a light reflecting face of the light reflecting portion comprises a metal.

6. A semiconductor light-emitting element according to claim 5, wherein the metal forming the at least one part of the light reflecting face comprises a has the same composition as that of a metal forming an at least any one of electrodes.

7. A semiconductor light-emitting element according to claim 1, wherein at least one part of the light reflecting face includes an inclined angle of around 45° with respect to a resonance direction.

8. A semiconductor light-emitting element according to claim 1, wherein at least one part of the light reflecting face includes an inclined angle of around 90° with respect to a resonance direction.

9. A semiconductor light-emitting element according to claim 1, wherein a reflecting film is formed on a side wall of the light-emitting layer positioned at a terminal end in a resonance direction.

10. A semiconductor light-emitting element as set in claim 9, wherein the reflecting film comprises an opaque insulating film.

11. A semiconductor light-emitting element as set in claim 9, wherein the reflecting film comprises a structure of two layers including a light transmission insulating film and a metal layer.

12. A semiconductor light-emitting element as set in claim 11, wherein said metal layer comprises substantially a same composition as that of a metal forming at least any one of the electrodes.

13. A semiconductor light-emitting element according to claim 1, wherein a slit including substantially a same size and shape in plan as those of the light reflecting portion in a vicinity of a light extracting face at an upper part of the light reflecting portion.

14. A semiconductor light-emitting element according to claim 13, wherein the slit is provided by forming a metallic film over a light extracting face of a crystal growth substrate.

15. A semiconductor light-emitting element, produced by arranging a plurality of semiconductor light-emitting elements according to claim 1 on one sheet of a crystal growth substrate, wherein the semiconductor light-emitting elements are integrated.

16. A communication apparatus comprising semiconductor light-emitting element, produced by arranging a plurality of semiconductor light-emitting elements according to claim 14 on one sheet of a crystal growth substrate, wherein the light-emitting elements of a semiconductor are integrated.

17. An information processing apparatus comprising a semiconductor light-emitting element, produced by arranging a plurality of semiconductor light-emitting elements according to claim 14 on one sheet of a crystal growth substrate, wherein the semiconductor light-emitting elements are integrated.

18. A semiconductor light-emitting element, produced by arranging a plurality of semiconductor light-emitting elements according to claim 2 on one sheet of a crystal growth substrate, wherein the semiconductor light-emitting elements are integrated.

19. A semiconductor light-emitting element, produced by arranging a plurality of semiconductor light-emitting elements according to claim 3 on one sheet of a crystal growth substrate, wherein the semiconductor light-emitting elements are integrated.

20. A semiconductor light-emitting element, produced by arranging a plurality of semiconductor light-emitting elements according to claim 4 on one sheet of a crystal growth substrate, wherein the semiconductor light-emitting elements are integrated.

* * * * *